(12) United States Patent
Wu

(10) Patent No.: US 11,935,917 B2
(45) Date of Patent: Mar. 19, 2024

(54) SEMICONDUCTOR STRUCTURE FORMING METHOD AND SEMICONDUCTOR STRUCTURE

(71) Applicant: CHANGXIN MEMORY TECHNOLOGIES, INC., Anhui (CN)

(72) Inventor: Chen En Wu, Hefei (CN)

(73) Assignee: CHANGXIN MEMORY TECHNOLOGIES, INC., Anhui (CN)

( * ) Notice: Subject to any disclaimer, the term of this patent is extended or adjusted under 35 U.S.C. 154(b) by 173 days.

(21) Appl. No.: 17/444,058

(22) Filed: Jul. 30, 2021

(65) Prior Publication Data

US 2022/0028966 A1   Jan. 27, 2022

Related U.S. Application Data

(63) Continuation of application No. PCT/CN2021/095610, filed on May 24, 2021.

(30) Foreign Application Priority Data

Jul. 27, 2020 (CN) .......................... 202010730710.5

(51) Int. Cl.
*H10B 12/00* (2023.01)
*H01L 49/02* (2006.01)

(52) U.S. Cl.
CPC .............. *H01L 28/60* (2013.01); *H10B 12/30* (2023.02)

(58) Field of Classification Search
CPC .............................. H10B 12/30; H10B 12/033
See application file for complete search history.

(56) References Cited

U.S. PATENT DOCUMENTS

| 7,101,785 B2 | 9/2006 | Hilliger |
| 8,970,039 B2 * | 3/2015 | Kuh ........................ H01L 28/91 |
| | | 257/E27.084 |
| 9,093,460 B2 | 7/2015 | Kim et al. |
| 9,287,349 B2 * | 3/2016 | Kim ........................ H01L 28/60 |
| 9,570,448 B2 | 2/2017 | Choi et al. |
| 9,673,272 B2 | 6/2017 | Choi et al. |
| 10,204,912 B2 * | 2/2019 | Ha ..................... H10B 12/0335 |

(Continued)

FOREIGN PATENT DOCUMENTS

| CN | 107634047 A | 1/2018 |
| CN | 108110025 A | 6/2018 |

(Continued)

*Primary Examiner* — Incent Wall
(74) *Attorney, Agent, or Firm* — Syncoda LLC; Feng Ma

(57) ABSTRACT

A method of forming a semiconductor structure includes: a substrate is provided, the substrate at least comprising a conducting layer; a bottom supporting layer and a stacking structure being formed on a top surface of the substrate, the stacking structure including a sacrificial layer and a supporting portion that are sequentially stacked and formed; the stacking structure and the bottom supporting layer are partially etched to expose the conducting layer to form a through hole; the supporting portion of a partial width exposed from a sidewall of the through hole is laterally etched to form an air gap; a protective layer filling the air gap is formed; a lower electrode electrically connected with the conducting layer is formed on the sidewall of the through hole and a sidewall of the protective layer; the sacrificial layer is removed.

6 Claims, 12 Drawing Sheets

(56) References Cited

U.S. PATENT DOCUMENTS

| | | | |
|---|---|---|---|
| 10,347,641 B2 | 7/2019 | Kim et al. | |
| 2014/0042520 A1* | 2/2014 | Lee | H10B 43/27 257/324 |
| 2014/0065785 A1* | 3/2014 | Yoon | H01L 28/91 438/381 |
| 2014/0103491 A1 | 4/2014 | Kim et al. | |
| 2016/0104763 A1* | 4/2016 | Choi | H01L 28/75 257/532 |
| 2016/0379985 A1 | 12/2016 | Choi et al. | |
| 2018/0342519 A1 | 11/2018 | Kim et al. | |

FOREIGN PATENT DOCUMENTS

| | | |
|---|---|---|
| CN | 108933143 A | 12/2018 |
| CN | 109065501 A | 12/2018 |

\* cited by examiner

SEMICONDUCTOR STRUCTURE FORMING METHOD AND SEMICONDUCTOR STRUCTURE

CROSS-REFERENCE TO RELATED APPLICATIONS

This application is a continuation of International Patent Application No. PCT/CN2021/095610 filed on May 24, 2021, which claims priority to Chinese Patent Application No. 202010730710.5 filed on Jul. 27, 2020. The disclosures of these applications are hereby incorporated by reference in their entirety.

BACKGROUND

A Dynamic Random-Access Memory (DRAM) is a type of semiconductor memory widely deployed in computer systems, and a main operation principle is to represent a binary bit using the quantity of electric charges stored in a capacitor. Therefore, position arrangement of a formed capacitor and a positional relationship between the capacitor and another structure are quite important in a forming process of a DRAM.

SUMMARY

The disclosure relates generally to the field of semiconductors, and more specifically to a semiconductor structure forming method and a semiconductor structure.

Embodiments of the disclosure provide a method of forming a semiconductor structure and a semiconductor structure. A stacking structure is reinforced to prevent the problem of collapse of the stacking structure, thereby improving the yield of a DRAM.

In order to solve the foregoing technical problem, the embodiments of the disclosure provide a method of forming a semiconductor structure, which may include the following operations: a substrate is provided, the substrate at least including a conducting layer, a bottom supporting layer and a stacking structure on a top surface of the bottom supporting layer being formed on a top surface of the substrate, and the stacking structure including a sacrificial layer and supporting portion that are sequentially stacked and formed. The stacking structure and the bottom supporting layer are partially etched to expose the conducting layer to form a through hole. The supporting portion of a partial width exposed from a sidewall of the through hole is laterally etched to form an air gap. A protective layer filling the air gap is formed. A lower electrode electrically connected with the conducting layer is formed on the sidewall of the through hole and a sidewall of the protective layer. The sacrificial layer is removed.

An edge of the supporting portion is liable to be oxidized, and the oxidized supporting portion is etched in a subsequent step of removing the sacrificial layer to form the air gap in the edge of the supporting portion, thereby resulting in collapse of the stacking structure. Compared with the related art, the present disclosure has the advantages that the protective layer is formed on the edge of the supporting portion to prevent the edge of the supporting portion from being oxidized, and the edge of the supporting portion is not oxidized and may not be etched away in the subsequent step of removing the sacrificial layer, so that the stability of the supporting portion is ensured, the formed stacking structure is stable, and the yield of a DRAM is improved.

The embodiments of the disclosure also provide a semiconductor structure, which may include: a substrate, the substrate at least including a conducting layer; a bottom supporting layer, located on a top surface of the substrate; a stacking structure, located on the top surface of the bottom supporting layer, the stacking structure including a sacrificial layer and a supporting portion that are sequentially stacked and formed; a through hole, located in the stacking structure and exposing the conducting layer; a lower electrode, located on a sidewall of the through hole and electrically connected with the conducting layer; and a protective layer, located between the lower electrode and the supporting portion.

DETAILED DESCRIPTION

A capacitor can be mainly supported and placed through a stacking structure, thereby solving the problem of toppling of the capacitor in a DRAM. However, the stacking structure is often arranged not so firmly, and collapse of the stacking structure may scrap the whole DRAM and further affect the yield of the DRAM seriously.

In order to solve the foregoing problem, an embodiment of the disclosure provides a method of forming a semiconductor structure, which includes the following operations. A substrate is provided, the substrate at least including a conducting layer, a bottom supporting layer and a stacking structure on a top surface of the bottom supporting layer being formed on a top surface of the substrate, and the stacking structure including a sacrificial layer and supporting portion that are sequentially stacked and formed. The stacking structure and the bottom supporting layer are partially etched to expose the conducting layer to form a through hole. The supporting portion of a partial width exposed from a sidewall of the through hole is laterally etched to form an air gap. A protective layer filling the air gap is formed. A lower electrode electrically connected with the conducting layer is formed on the sidewall of the through hole and a sidewall of the protective layer. The sacrificial layer is removed.

In order to make the objectives, technical solutions, and advantages of the embodiments of the disclosure clearer, each embodiment of the disclosure will be described below in detail in combination with the drawings. However, those of ordinary skill in the art can understand that, in each embodiment of the disclosure, many technical details are proposed to make readers understand the disclosure better. However, the technical solutions claimed by the disclosure may also be implemented even without these technical details and various variations and modifications made based on each of the following embodiments. Division of each of the following embodiments is for ease of description and should not form any limit to specific implementation modes of the disclosure. Each embodiment can be combined and refer to each other without conflicts.

FIG. 1 to FIG. 11 are sectional structure diagrams corresponding to each step of a method of forming a semiconductor structure according to an embodiment of the disclosure. The method of forming a semiconductor structure of the embodiment will be specifically described below.

Figure 1:
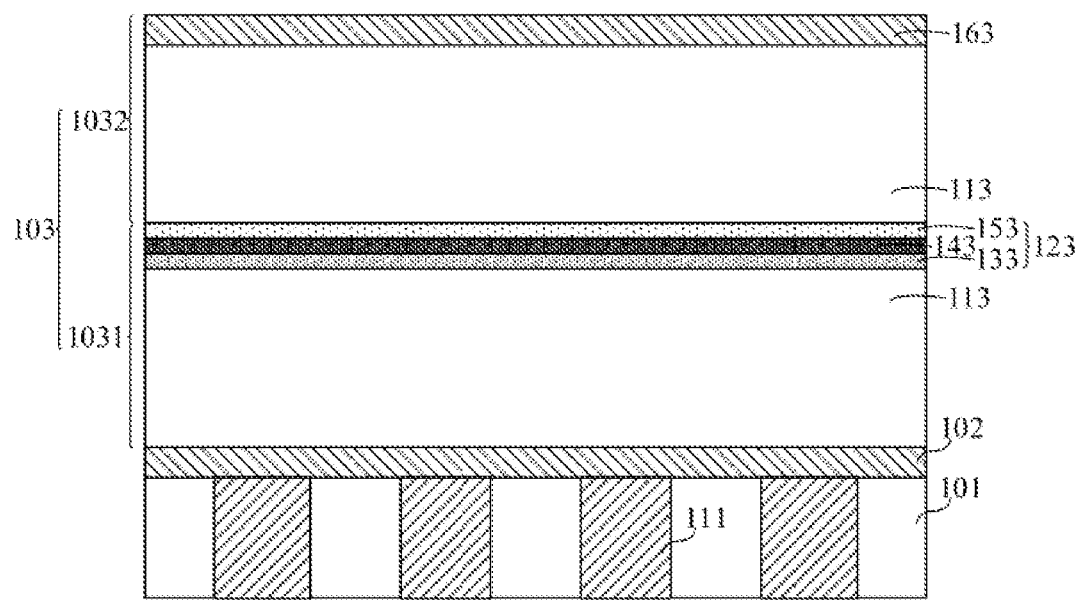
FIG. 1 is a first sectional structure diagram corresponding to each step of a method of forming a semiconductor structure according to an embodiment of the disclosure.

Referring to FIG. 1, a substrate 101 is provided. The substrate 101 at least includes a conducting layer 111.

A material for the substrate 101 may include silicon, silicon carbide, silicon nitride, Silicon On Insulator (SOI), Strained Silicon On Insulator (SSOI), Strained Silicon Germanide On Insulator (S—SiGeOI), Silicon Germanide On Insulator (SiGeOI), Germanium On Insulator (GeOI), etc. In the embodiment, silicon is adopted for the substrate 101. Those skilled in the art knows that silicon is adopted as the substrate 101 in the embodiment for a purpose of making it easy for those skilled in the art to understand the subsequent forming method, no limits are formed, and a suitable material may be selected for the substrate as required in a practical application process.

The conducting layer 111 may be a conducting material or formed by multiple conducting materials, for example, doped with polysilicon, titanium, titanium nitride, tungsten, and a composite of tungsten. In the embodiment, tungsten is adopted for the conducting layer 111. The conducting layer 111 is configured to electrically connect a subsequently formed lower electrode to implement electrical connection between a subsequently formed capacitor structure and the substrate 101.

It is to be noted that the substrate 101 also includes other semiconductor structures except the conducting layer 111, such as shallow trench isolation structures, word line structures, and active areas. The other semiconductor structures do not involve the core technology of the disclosure, and will not be elaborated herein. Those skilled in the art can understood that the substrate 101 also includes the other semiconductor structures except the conducting layer 111 to ensure normal running of the semiconductor structure.

Referring back to FIG. 1, a bottom supporting layer 102 and a stacking structure 103 on a top surface of the bottom supporting layer 102 are formed on a top surface of the substrate 101, and the stacking structure 103 includes a sacrificial layer and supporting portion that are sequentially stacked and formed. In the embodiment, the stacking structure 103 includes a first stacking structure 1031 and second stacking structure 1032 that are sequentially formed. The first stacking structure 1031 is on the top surface of the bottom supporting layer 102. The first stacking structure 1031 includes a first sacrificial layer (a sacrificial layer 113 below a middle supporting portion 123) and middle supporting portion 123 that are sequentially formed. The second stacking structure 1032 includes a second sacrificial layer (the sacrificial layer 113 above the middle supporting portion 123) and top-layer supporting portion 163 that are sequentially formed.

The bottom supporting layer 102 is on the top surface of the substrate 101, and is configured to prevent the subsequently formed stacking structure 103 from forming an electrical connection with the substrate 101, and the bottom supporting layer 102 is configured as a bottom-layer structure of the stacking structure 103 to reinforce the subsequently formed stacking structure 103. Specifically, a material for the bottom supporting layer 102 includes silicon nitride or silicon oxynitride. In the embodiment, the material for the bottom supporting layer 102 is silicon nitride.

Specifically, after a capacitor hole is formed in the stacking structure 103, and the lower electrode is deposited, first openings are required to be formed in the top-layer supporting portion to etch the sacrificial layer 113. After the capacitor hole is formed by etching, the middle supporting portion 123 is exposed to the air, and is very liable to be oxidized to form an oxide layer, and after the lower electrode is deposited, the oxide layer is sandwiched between the middle supporting portion 123 and the lower electrode. When the second sacrificial layer is subsequently etched away through the first openings, the oxide layer between the middle supporting portion 123 and the lower electrode is very liable to be etched to form an air gap between the middle supporting portion 123 and the lower electrode, so the supporting portion cannot support the electrode, and the subsequently formed electrode is unstable. In addition, an etchant flows to the first sacrificial layer from the air gap, so a bad shape is formed when the first sacrificial layer is etched.

The sacrificial layer 113 is configured to subsequently form the air gap, and the air gap is configured to subsequently form a dielectric layer and an upper electrode. After the sacrificial layer is removed and before the dielectric layer and the upper electrode are formed, the stacking structure 103 is hollowed, so the stability of the stacking structure 103 is required to be ensured.

Specifically, the sacrificial layer 113 is formed on the top surface of the bottom supporting layer 102. A material for the sacrificial layer 113 is Boron-Phosphorosilicate Glass (BPSG) or an oxygen-containing material. In a subsequent process of removing the sacrificial layer 113 to form the air gap, targeted etching may be performed using a wet etching process to remove the sacrificial layer. Since the wet etching process is targeted, the top-layer supporting portion 163, the middle supporting portion 123, and the bottom supporting layer 102 may not etched in the process of removing the sacrificial layer 113. Therefore, the phenomenon that the stacking structure 103 collapses in the process of forming the air gap is avoided.

In the embodiment, the middle supporting portion 123 includes a first supporting layer 133, buffer layer 143, and second supporting layer 153 that are sequentially stacked and formed.

Specifically, the first supporting layer 133 is formed on a top surface of the first sacrificial layer, and the first supporting layer 133 is mainly configured to support the subsequently formed capacitor structure. In an example, materials for the first supporting layer 133 and the second supporting layer 153 include silicon carbonitride, and a carbon content of the first supporting layer 133 is greater than a carbon content of the second supporting layer 153. Since the carbon content is relatively high, the first supporting layer 133 is endowed with relatively high hardness to support the subsequent capacitor structure. In another example, a nitrogen content of the second supporting layer 153 is greater than a nitrogen content of the first supporting layer 133, so that it is ensured that the carbon content of the first supporting layer 133 is greater than the carbon content of the second supporting layer 153.

Specifically, the first supporting layer 133 is formed by first Chemical Vapor Deposition (CVD). A gas mixture adopted for first CVD includes a carbon-containing gas TMS, $SIH_4$, $NH_3$, and $N_2$. A flow of the carbon-containing gas TMS is adjusted to control a carbon content of deposited SiCN.

The buffer layer 143 is formed on a top surface of the first supporting layer 133. The buffer layer 143 is configured to separate the first supporting layer 133 from the second supporting layer 153. The buffer layer 143 is further configured for antioxidation. In an example, a material for the buffer layer 143 includes silicon nitride.

The second supporting layer 153 is formed on a top surface of the buffer layer 143, and the second supporting layer 153 is mainly configured to prevent the middle supporting portion 123 from being oxidized. In an example, the materials for the first supporting layer 133 and the second supporting layer 153 include silicon carbonitride, and the nitrogen content of the second supporting layer 153 is greater than the nitrogen content of the first supporting layer 133. Since the nitrogen content is relatively high, the second supporting layer 153 is endowed with relatively high oxidation resistance to prevent the second supporting layer 153 from being oxidized. In another example, the carbon content of the first supporting layer 133 is greater than the carbon content of the second supporting layer 153, so that it is ensured that the nitrogen content of the second supporting layer 153 is greater than the nitrogen content of the first supporting layer 133.

Specifically, the second supporting layer 153 is formed by second CVD. A gas mixture adopted for second CVD includes the carbon-containing gas TMS, $SIH_4$, $NH_3$, and $N_2$. A flow of $NH_3$ is adjusted to control a nitrogen content of the deposited SiCN.

The first supporting layer 133 is arranged to be a silicon carbonitride layer with a relatively high carbon content, so that the stability of the middle supporting portion 123 is improved. The second supporting layer 153 is arranged to be a silicon carbonitride layer with a relatively high nitrogen content, so that the middle supporting portion 123 is prevented from being oxidized after the capacitor hole is etched, and an oxidized part of the middle supporting portion 123 may be prevented from being etched by DHF when the sacrificial layer is etched. In addition, the buffer layer 143 may further improve the oxidation resistance of the middle supporting portion 123.

In addition, in the embodiment, a range of a thickness relationship between the formed first supporting layer 133, the buffer layer 143, and the second supporting layer 153 is 2:1:2<the first supporting layer 133:the buffer layer 143:the second supporting layer 153<10:1:2. The thickness relationship between the first supporting layer 133, the buffer layer 143, and the second supporting layer 153 is reasonably set to ensure the stability of the middle supporting portion 123.

In an example, a thickness of the first supporting layer 133 is 4 nm to 30 nm, for example, 5 nm, 10 nm, 15 nm, 20 nm, 25 nm, or 30 nm. A thickness of the buffer layer 143 is 1 nm to 6 nm, for example, 1 nm, 2 nm, 3 nm, 4 nm, 5 nm, or 6 nm. A thickness of the second supporting layer 153 is 2 nm to 12 nm, for example, 2 nm, 4 nm, 6 nm, 8 nm, 10 nm, or 12 nm.

It is to be noted that the above examples of the thicknesses of the first supporting layer 133, the buffer layer 143, and the second supporting layer 153 are only schematic descriptions about the thicknesses of the first supporting layer 133, the buffer layer 143, and the second supporting layer 153, and do not form limits to the embodiment of the disclosure.

In another embodiment, the middle supporting portion may also be formed by a double-layer structure. In such case, a material for the middle supporting portion includes a combination of silicon carbonitride and silicon nitride, namely silicon nitride is arranged above silicon carbonitride. Silicon carbonitride may be arranged in a manner that, from a bottom surface to a top surface, a nitrogen content gradually increases or a carbon content gradually decreases.

It is to be noted that the semiconductor structure forming method is introduced in the embodiment taking the first stacking structure 1031 and the second stacking structure 1032 as an example, and in another embodiment, one, three, or more than three stacking structures 103 may be formed on the top surface of the bottom supporting layer.

An overlapping region is formed between the conducting layer 111 and an orthographic projection of the middle supporting portion 123 on the substrate 101 to ensure that a through hole is easily formed in the middle supporting portion by a subsequent process to expose the conducting layer 111, thereby forming the lower electrode electrically connected with the conducting layer 111.

Figure 2:
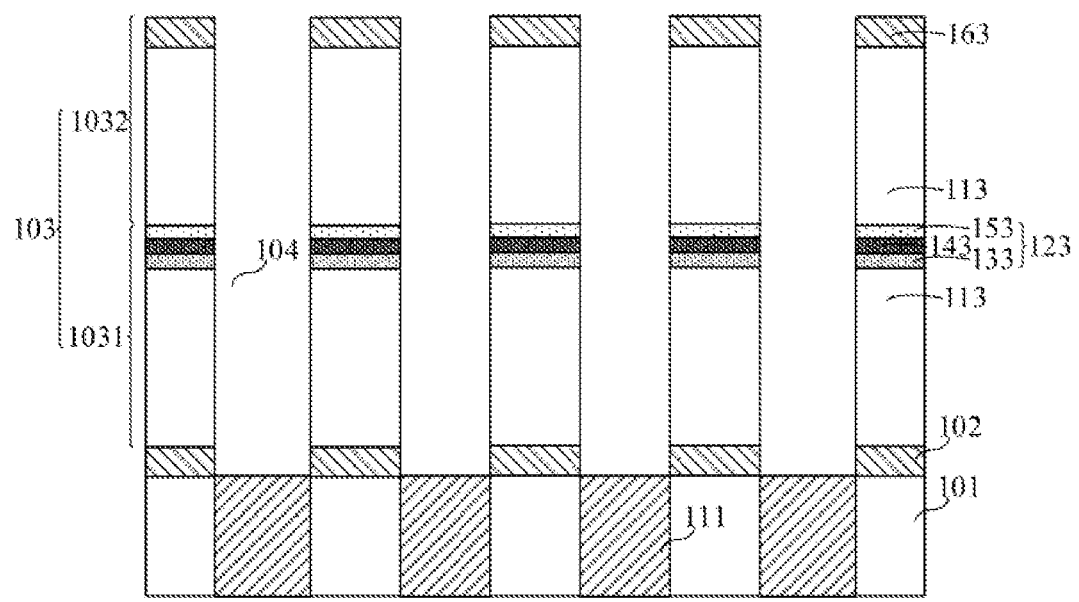
FIG. 2 is a second sectional structure diagram corresponding to each step of a method of forming a semiconductor structure according to an embodiment of the disclosure.
Figure 3:
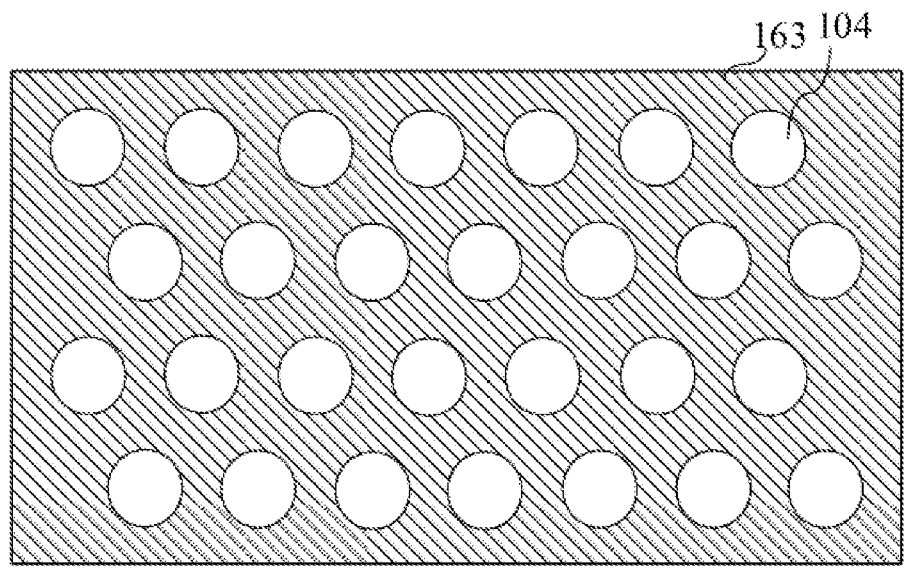
FIG. 3 is a third sectional structure diagram corresponding to each step of a method of forming a semiconductor structure according to an embodiment of the disclosure.
Figure 4:
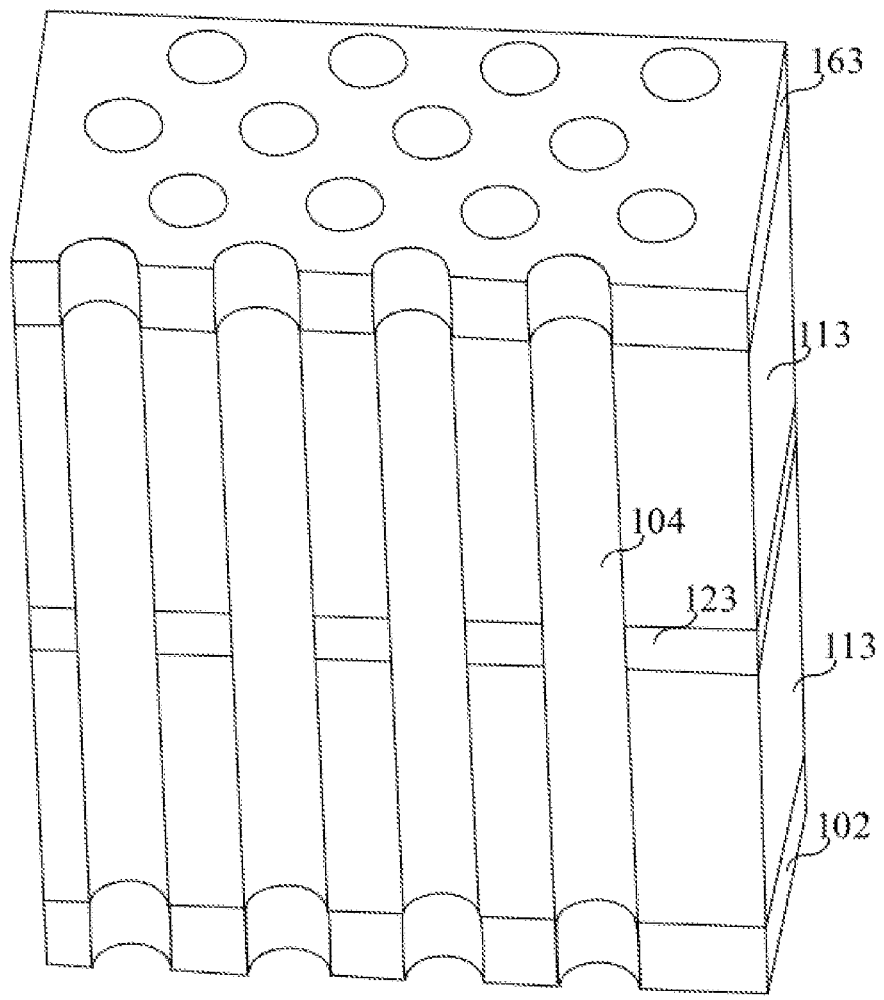
FIG. 4 is a fourth sectional structure diagram corresponding to each step of a method of forming a semiconductor structure according to an embodiment of the disclosure.

Referring to FIG. 2 to FIG. 4, the stacking structure 103 and the bottom supporting layer 102 are partially etched until the conducting layer 111 is exposed to form the through hole 104. FIG. 2 is a sectional view of the through hole 104 formed by etching. FIG. 3 is a top view of the through hole 104 formed by etching, to present an arrangement manner of the through hole 104. FIG. 4 is a three-dimensional diagram of the formed through hole 104. It is to be noted that exemplary descriptions are made in the embodiment taking a circular through hole 104 as an example, and in another embodiment, the through hole may be shaped into a triangle, a quadrangle, a pentagon, etc. The shape of the through hole 104 is not specifically limited in the embodiment, and the shape of the through hole 104 may be set as practically required.

Figure 5:
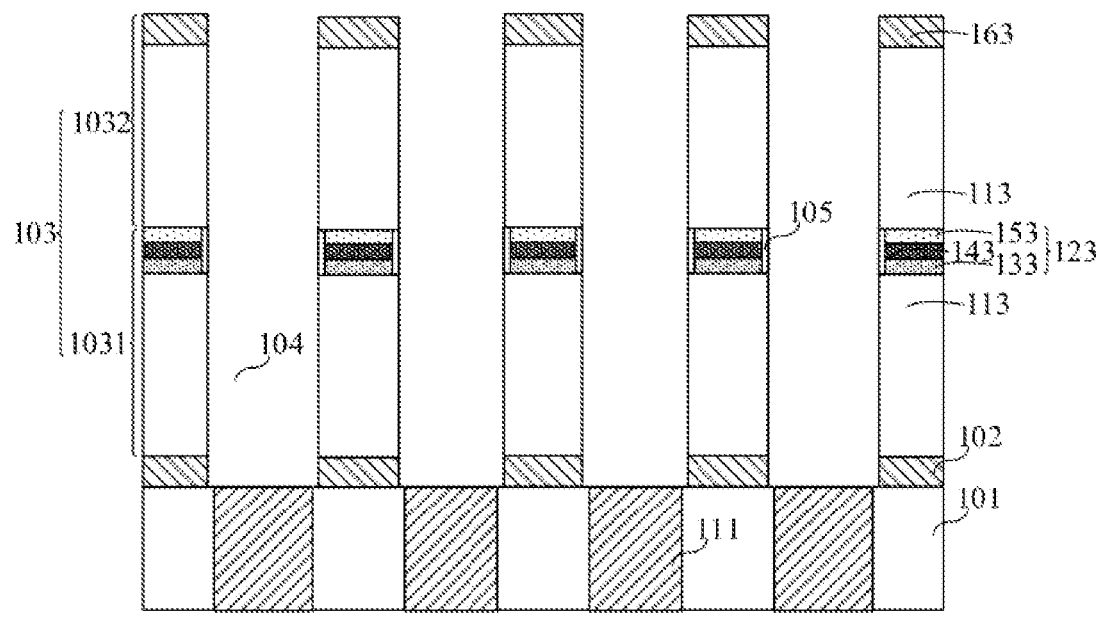
FIG. 5 is a fifth sectional structure diagram corresponding to each step of a method of forming a semiconductor structure according to an embodiment of the disclosure.

Referring to FIG. 5, the middle supporting portion 123 of a partial width exposed from a sidewall of the through hole 104 is laterally etched along the sidewall of the through hole 104 to form an air gap 105.

Referring to FIG. 5, the middle supporting portion 123 of a preset thickness is etched away. In an example, the middle supporting portion 123 of the preset thickness may be removed by wet etching. Specifically, the middle supporting portion 123 of the preset thickness is removed by DSP and IPA. In another embodiment, the middle supporting portion 123 of the preset thickness may also be removed by chemical dry etching. Specifically, the etched middle supporting portion 123 includes the oxidized middle supporting portion 123, and the remaining middle supporting portion 123 does not include the oxidized part. A specific etching width needs to be specifically set according to an oxidation degree of the middle supporting portion 123.

Figure 6:
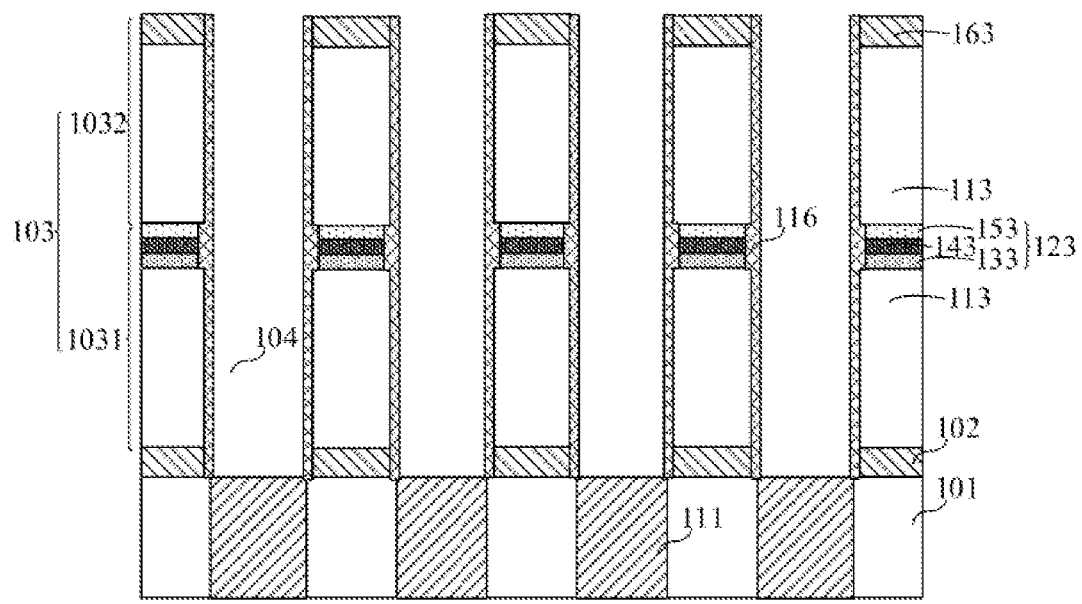
FIG. 6 is a sixth sectional structure diagram corresponding to each step of a method of forming a semiconductor structure according to an embodiment of the disclosure.
Figure 7:
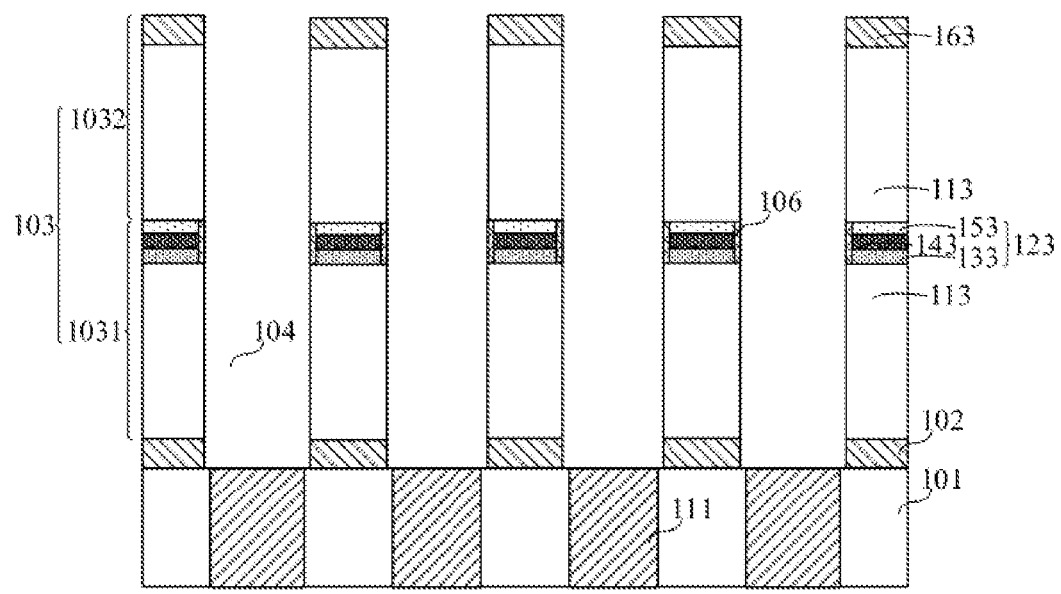
FIG. 7 is a seventh sectional structure diagram corresponding to each step of a method of forming a semiconductor structure according to an embodiment of the disclosure.

Referring to FIG. 6 and FIG. 7, a protective layer 106 filling the air gap is formed.

Specifically, referring to FIG. 6, a protective film 116 is formed on the sidewall of the through hole 104, and the formed protective film 116 fills the air gap 105. From etching of the middle supporting portion 123 of the partial width to formation of the protective film, the middle supporting portion 123 is prevented from being re-oxidized by $N_2$ protection method. In the embodiment, materials for the protective film 116 and the protective layer 106 are silicon nitride.

In an example, the protective film 116 is formed by Atomic Layer Deposition (ALD). The protective film 116 formed by an ALD process has high coverage performance. The protective layer 106 is formed on an edge of the middle supporting portion 123 to prevent the edge of the middle supporting portion 123 from being oxidized. The edge of the middle supporting portion 123 is not oxidized and may not be etched away in a subsequent step of removing the sacrificial layer 113, so that the stability of the middle supporting portion 123 is ensured, the formed stacking structure 103 is stable, and the yield of a DRAM is improved.

Referring to FIG. 7, the protective film 116 on the sidewall of the through hole 104 is removed to form the protective layer 106.

Specifically, the protective film 116 on the sidewall of the through hole 104 is removed by a second dry etching process. A gas mixture adopted for the second dry etching process includes $SF_6$, $CF_x$, $CL_2$, and argon. In another embodiment, the protective film on the sidewall of the through hole may also be removed by a wet cleaning process.

It is to be noted that, in the embodiment, a thickness of the protective layer 106 shown in the drawing is consistent with a thickness of the air gap, and in another embodiment, the thickness of the remaining protective layer may be greater than the thickness of the air gap.

Figure 8:
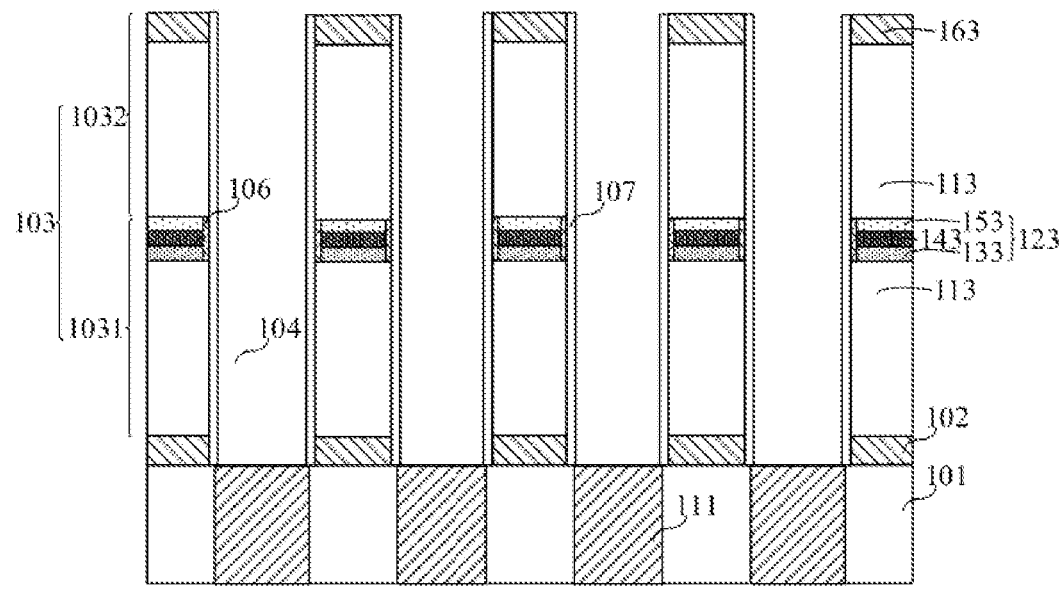
FIG. 8 is an eighth sectional structure diagram corresponding to each step of a method of forming a semiconductor structure according to an embodiment of the disclosure.

Referring to FIG. 8, a lower electrode 107 electrically connected with the conducting layer 111 is formed on the sidewall of the through hole 104 and the sidewall of the protective layer 106. The lower electrode 107 further includes a top surface covering the conducting layer 111. The lower electrode 107 may be a conducting material or formed by multiple conducting materials, for example, doped with polysilicon, titanium, titanium nitride, tungsten, and a composite of tungsten. In the embodiment, titanium nitride is adopted for the lower electrode 107.

Figure 9:
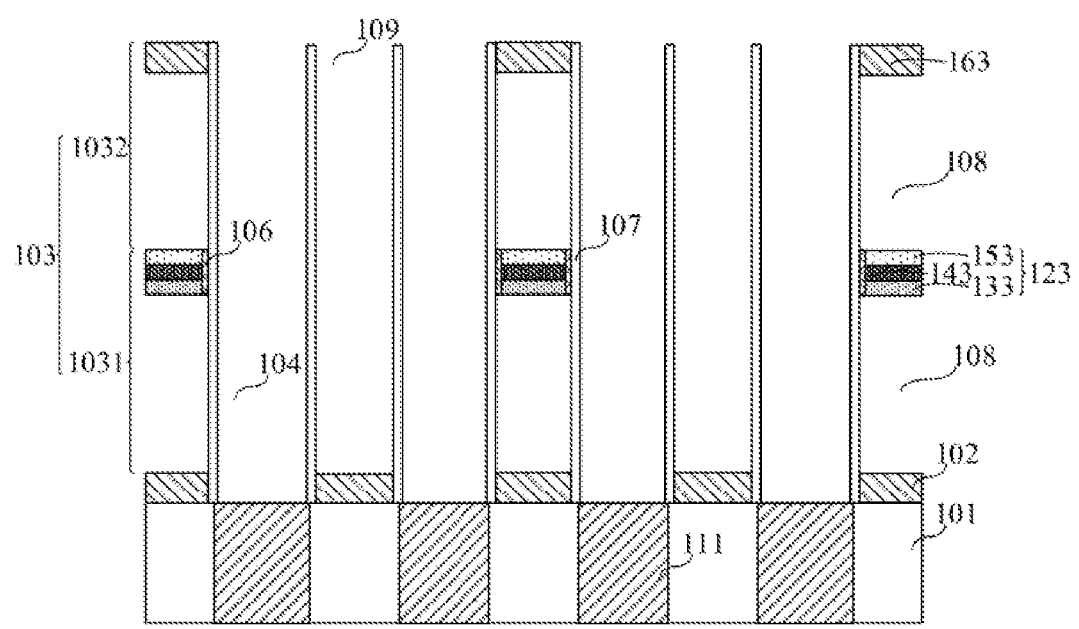
FIG. 9 is a ninth sectional structure diagram corresponding to each step of a method of forming a semiconductor structure according to an embodiment of the disclosure.
Figure 10:
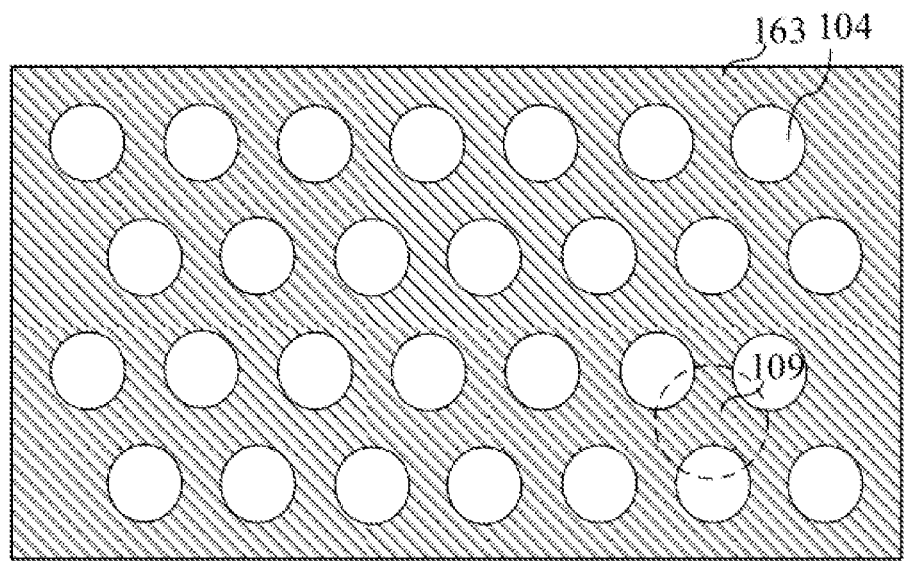
FIG. 10 is a tenth sectional structure diagram corresponding to each step of a method of forming a semiconductor structure according to an embodiment of the disclosure.
Figure 11:
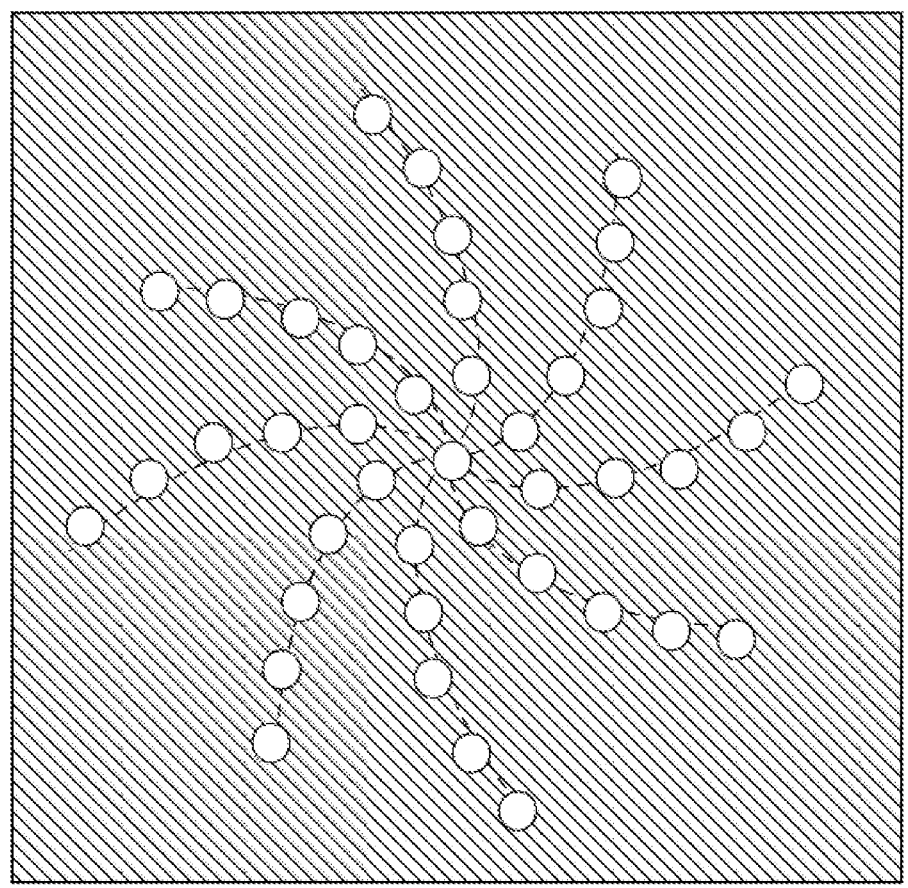
FIG. 11 is an eleventh sectional structure diagram corresponding to each step of a method of forming a semiconductor structure according to an embodiment of the disclosure.

Referring to FIG. 9 to FIG. 11, the sacrificial layer 113 is removed.

Specifically, referring to FIG. 9, multiple first openings 109 (the dotted part in FIG. 9) are formed in the remaining top-layer supporting portion 163, the first openings exposing the second sacrificial layer 113, and the second sacrificial layer is removed. The middle supporting portion 123 is etched along the first openings 109, multiple second openings are formed in the left middle supporting portion 123, the second openings exposing the first sacrificial layer 113, and the first sacrificial layer below the middle supporting portion is removed. Projections of the second opening and the first opening 109 on the substrate 101 are completely overlapped or partially overlapped.

In an example, referring to FIG. 10 and FIG. 11, the formed first openings are in the top-layer supporting portion 163 between the through holes 104, and overalls of the multiple first openings 109 are formed radially. Compared with formation of openings in the related art, the overall of the first openings are formed radially, such that the overall number of formed openings can be reduced. In addition, etching damages to the middle supporting portion 123 are reduced when the sacrificial layer is etched, and the stability of the stacking structure 103 is further ensured. It is to be noted that exemplary descriptions are made in the embodiment taking a square shape for the first opening 109 as an example. In other embodiments, the first opening may be shaped into a triangle, a square, a pentagon, etc. The shape of the first opening 109 is not specifically limited in the embodiment, and the shape of the first opening 109 may be set as practically required.

In another embodiment, after the sacrificial layer 113 is etched, the dielectric layer and the upper electrode are deposited to form the capacitor structure.

In the embodiment, nitrogen is continuously introduced in time intervals between each step of the method of forming semiconductor structure. Nitrogen is continuously introduced to isolate the semiconductor structure from contacting with oxygen, thereby preventing the semiconductor structure from being oxidized.

In the embodiment, the time intervals between each step are shortened when the method of forming semiconductor structure is executed. Waiting time between each step in the manufacturing process is reduced to prevent the semiconductor structure from being oxidized.

The edge of the supporting portion is liable to be oxidized, and the oxidized supporting portion is etched in the subsequent step of removing the sacrificial layer to form the air gap in the edge of the supporting portion, thereby resulting in collapse of the stacking structure. Compared with the related art, the disclosure has the advantages that the protective layer is formed on the edge of the supporting portion to prevent the edge of the supporting portion from being oxidized, and the edge of the supporting portion is not oxidized and may not be etched away in the subsequent step of removing the sacrificial layer, so that the stability of the supporting portion is ensured, the formed stacking structure is stable, and the yield of the DRAM is improved.

The above steps are divided only for clear description. During implementation, the steps may be combined into one step, or some steps may be split into multiple steps, and any solution including the same logical relationship falls within the scope of protection of the disclosure. Adding insignificant modifications to the flow or introducing insignificant designs without changing the core design of the flow falls within the scope of protection of the disclosure.

Another embodiment of the disclosure provides a method of forming a semiconductor structure. The difference with the abovementioned embodiment is that there are at least two stacking structures in the embodiment. In the embodiment, exemplary descriptions are made taking the condition that the stacking structure includes a first stacking structure, a second stacking structure, and a third stacking structure as an example. Those skilled in the art should know that, based on the embodiment, a stacking structure may further be formed at a top of the second stacking structure, namely all single stacking structures similar to the embodiment shall fall within the scope of protection of the disclosure.

Figure 12:
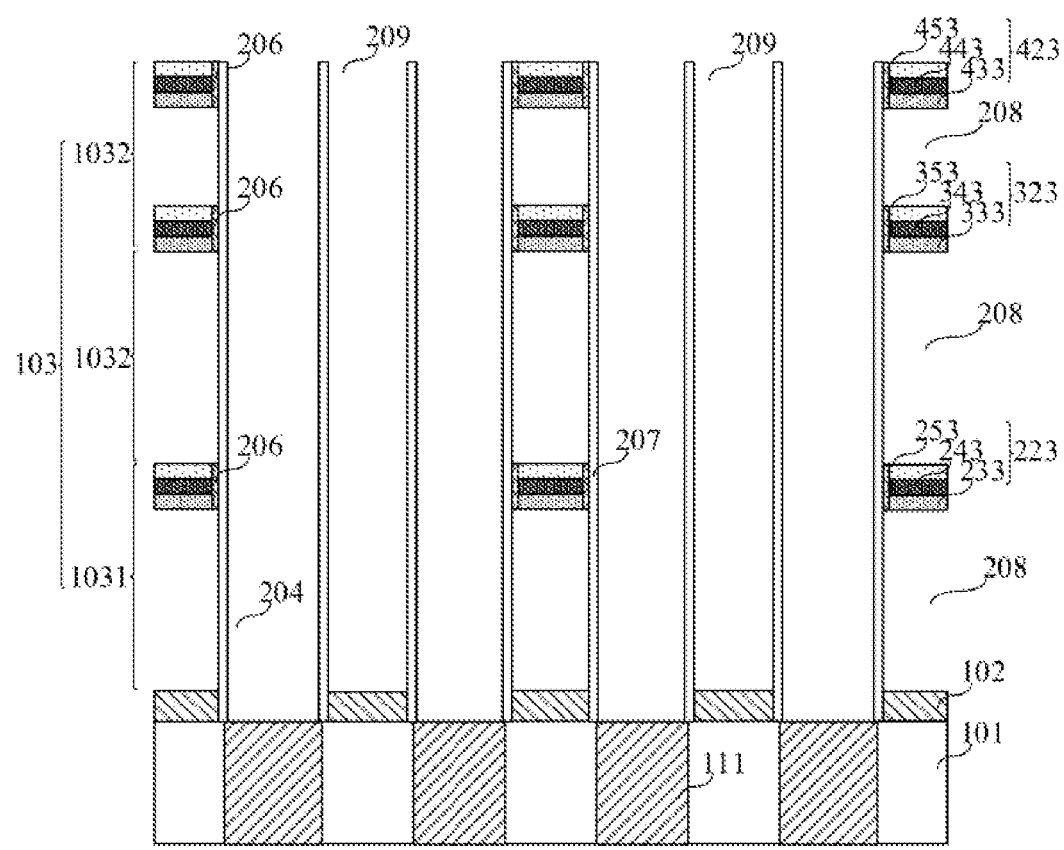
FIG. 12 is a sectional structure diagram corresponding to a method of forming a semiconductor structure according to another embodiment of the disclosure.

FIG. 12 is a sectional structure diagram corresponding to a method of forming a semiconductor structure according to another embodiment of the disclosure. The method of forming a semiconductor structure of the embodiment will be specifically described below.

Specifically, the stacking structure 203 includes a first stacking structure 2031, a second stacking structure 2032, and a third stacking structure 2033.

The first stacking structure 2031 includes a first sacrificial layer and first middle supporting portion 223 that are sequentially stacked on the bottom supporting layer 102. The first sacrificial layer is etched in a subsequent process to form an air gap 208.

Specifically, the first middle supporting portion 223 includes a first supporting layer 233, first buffer layer 243, and second supporting layer 253 that are sequentially stacked and formed. In an example, materials for the first supporting layer 233 and the second supporting layer 253 include silicon carbonitride, and a carbon content of the first supporting layer 233 is greater than a carbon content of the second supporting layer 253. Since the carbon content is relatively high, the first supporting layer 233 is endowed with relatively high hardness to support the subsequent capacitor structure. The first buffer layer 243 is configured to separate the first supporting layer 233 from the second supporting layer 253, and a material for the first buffer layer 243 includes silicon nitride. A nitrogen content of the second supporting layer 253 is greater than a nitrogen content of the first supporting layer 233. Since the nitrogen content is relatively high, the second supporting layer 253 is endowed with relatively high oxidation resistance to prevent the first middle supporting portion 223 from being oxidized.

The second stacking structure includes a second sacrificial layer and second middle supporting portion 323 that are sequentially stacked on the first stacking structure 2031. The second sacrificial layer is etched in the subsequent process to form an air gap 208.

Specifically, the second middle supporting portion 323 includes a third supporting layer 333, a second buffer layer 343, and a fourth supporting layer 353 that are sequentially stacked and formed. In an example, materials for the third supporting layer 333 and the fourth supporting layer 353 include silicon carbonitride, and a carbon content of the third supporting layer 333 is greater than a carbon content of the fourth supporting layer 353. Since the carbon content is relatively high, the third supporting layer 333 is endowed with relatively high hardness to support the subsequent capacitor structure. The second buffer layer 343 is configured to separate the third supporting layer 333 from the fourth supporting layer 353, and a material for the second buffer layer 343 includes silicon nitride. A nitrogen content of the fourth supporting layer 353 is greater than a nitrogen content of the third supporting layer 333. Since the nitrogen content is relatively high, the fourth supporting layer 353 is endowed with relatively high oxidation resistance to prevent the second middle supporting portion 323 from being oxidized.

The third stacking structure 2033 includes a third sacrificial layer and top-layer supporting portion 423 that are sequentially stacked on the second stacking structure 2032. The third sacrificial layer is etched in the subsequent process to form an air gap 208.

Specifically, the top-layer supporting portion 423 includes a fifth supporting layer 433, third buffer layer 443, and sixth supporting layer 453 that are sequentially stacked and formed. In an example, materials for the fifth supporting layer 433 and the sixth supporting layer 453 include silicon carbonitride, and a carbon content of the fifth supporting layer 433 is greater than a carbon content of the sixth supporting layer 453. Since the carbon content is relatively high, the fifth supporting layer 433 is endowed with relatively high hardness to support the subsequent capacitor structure. The third buffer layer 443 is configured to separate the fifth supporting layer 433 from the sixth supporting layer 453, and a material for the third buffer layer 443 includes silicon nitride. A nitrogen content of the sixth supporting layer 453 is greater than a nitrogen content of the fifth supporting layer 433. Since the nitrogen content is relatively high, the sixth supporting layer 453 is endowed with relatively high oxidation resistance to prevent the top-layer supporting portion 423 from being oxidized.

The other forming methods after the stacking structure 203 are the same as the abovementioned embodiment, and will not be elaborated in the embodiment. Finally, the semiconductor structure shown in FIG. 12 is formed.

In the embodiment, not only is the middle supporting portion a three-layer laminated structure, but also the top-layer supporting portion 423 is manufactured using a three-layer laminated structure to further reinforce the formed stacking structure 203. Moreover, the protective layer 206 is on an edge of the top-layer supporting portion 423, and is configured to protect the edge of the top-layer supporting portion 423 from being oxidized.

It is to be noted that exemplary descriptions are made in the embodiment taking the condition that the stacking structure 203 includes three stacking substructures 203 as an example, and in another embodiment, the stacking structure may include more than three stacking structures.

The edge of the supporting portion is liable to be oxidized, and the oxidized supporting portion is etched in the subsequent step of removing the sacrificial layer to form the air gap in the edge of the supporting portion, thereby resulting in collapse of the stacking structure. Compared with the related art, the disclosure has the advantages that the protective layer is formed on the edge of the supporting portion to prevent the edge of the supporting portion from being oxidized, and the edge of the supporting portion is not oxidized and may not be etched away in the subsequent step of removing the sacrificial layer, so that the stability of the supporting portion is ensured, the formed stacking structure is stable, and the yield of the DRAM is improved.

The above steps are divided only for clear description. During implementation, the steps may be combined into one step, or some steps may be split into multiple steps, and any solution including the same logical relationship falls within the scope of protection of the disclosure. Adding insignificant modifications to the flow or introducing insignificant designs without changing the core design of the flow falls within the scope of protection of the disclosure.

The abovementioned embodiment corresponds to the present embodiment, so that the present embodiment can be matched with the abovementioned embodiment for implementation. The related technical details mentioned in the abovementioned embodiment are still effective in the present embodiment, and the technical effects that may be achieved in the abovementioned embodiment may also be achieved in the present embodiment. For reducing repetitions, elaborations are omitted herein. Correspondingly, related technical details mentioned in the present embodiment may also be applied to the abovementioned embodiment.

Another embodiment of the disclosure relates to a semiconductor structure.

Referring to FIG. 9, the semiconductor structure provided in the embodiment will be described below in detail in combination with the drawing. Parts the same as or corresponding to the abovementioned embodiments will not be elaborated below.

The semiconductor structure includes: a substrate 101, the substrate 101 at least including a conducting layer 111; a bottom supporting layer 102, located on a top surface of the substrate 101; a stacking structure 103, located on at top surface of the bottom supporting layer 102, the stacking structure 103 including a sacrificial layer and supporting portion that are sequentially stacked and formed; a through hole 104, located in the stacking structure 103 and exposing the conducting layer 111; a lower electrode 107, located on a sidewall of the through hole 104 and electrically connected with the conducting layer 111; and a protective layer 106, located between the lower electrode 107 and the supporting portion. In another embodiment, the protective layer 106 is on an edge of a top-layer supporting portion 163, and is configured to prevent the top-layer supporting portion 163 from being oxidized.

It is to be noted that exemplary descriptions are made in the embodiment taking the condition that the stacking structure 103 includes two stacking substructures 103 as an example, and in another embodiment, the stacking structure may include three or more than three stacking structures.

A material for the substrate 101 may include silicon, silicon carbide, silicon nitride, SOI, SSOI, S—SiGeOI, SiGeOI, GeOI, etc. In the embodiment, silicon is adopted for the substrate 101. Those skilled in the art knows that silicon is adopted as the substrate 101 in the embodiment for a purpose of making it easy for those skilled in the art to understand the subsequent forming method, no limits are formed, and a suitable material may be selected for the substrate as required in a practical disclosure process.

The conducting layer 111 may be a conducting material or formed by multiple conducting materials, for example, doped with polysilicon, titanium, titanium nitride, tungsten, and a composite of tungsten. In the embodiment, tungsten is adopted for the conducting layer 111. The conducting layer 111 is configured to electrically connect a subsequently formed lower electrode to implement electrical connection between a subsequently formed capacitor structure and the substrate 101.

It is to be noted that the substrate 101 also includes other semiconductor structures except the conducting layer 111, such as shallow trench isolation structures, word line structures, and active areas. The other semiconductor structures do not involve the core technology of the disclosure, and will not be elaborated herein. Those skilled in the art can understood that the substrate 101 also includes the other semiconductor structures except the conducting layer 111 to ensure normal running of the semiconductor structure.

The bottom supporting layer 102 is on the top surface of the substrate 102, and is configured to prevent the subsequently formed stacking structure 103 from forming an electrical connection with the substrate 101, and the bottom supporting layer 102 is configured as a bottom-layer structure of the stacking structure 103 to reinforce the subsequently formed stacking structure 103. Specifically, a material for the bottom supporting layer 102 includes silicon nitride or silicon oxynitride. In the embodiment, the material for the bottom supporting layer 102 is silicon nitride.

In the embodiment, the stacking structure includes the sacrificial layer and supporting portion that are sequentially stacked and formed. In the embodiment, the stacking structure 103 includes a first stacking structure 1031 and second stacking structure 1032 that are sequentially formed. The first stacking structure 1031 is on the top surface of the bottom supporting layer 102. The first stacking structure 1031 includes a first sacrificial layer (a sacrificial layer 113 below a middle supporting portion 123) and middle supporting portion 123 that are sequentially formed. The second stacking structure 1032 includes a second sacrificial layer (the sacrificial layer 113 above the middle supporting portion 123) and top-layer supporting portion 163 that are sequentially formed. The sacrificial layer 113 is configured to subsequently form an air gap, and the air gap is configured to subsequently form a dielectric layer and an upper electrode. After the sacrificial layer is removed and before the dielectric layer and the upper electrode are formed, the stacking structure 103 is hollowed, so the stability of the stacking structure 103 is required to be ensured.

In the embodiment, the middle supporting portion 123 includes a first supporting layer 133, buffer layer 143, and second supporting layer 153 that are sequentially stacked and formed.

Specifically, the first supporting layer 133 is on a top surface of the first sacrificial layer, and the first supporting layer 133 is mainly configured to support the subsequently formed capacitor structure. In an example, materials for the first supporting layer 133 and the second supporting layer 153 include silicon carbonitride, and a carbon content of the first supporting layer 133 is greater than a carbon content of the second supporting layer 153. Since the carbon content is relatively high, the first supporting layer 133 is endowed with relatively high hardness to support the buffer layer 143 and the second supporting layer 153. In another example, a nitrogen content of the second supporting layer 153 is greater than a nitrogen content of the first supporting layer 133, so that it is ensured that the carbon content of the first supporting layer 133 is greater than the carbon content of the second supporting layer 153.

The buffer layer 143 is on a top surface of the first supporting layer 133, and is configured to separate the first supporting layer 133 from the second supporting layer 153. The buffer layer 143 is further configured for antioxidation. In an example, a material for the buffer layer 143 includes silicon nitride.

The second supporting layer 153 is on a top surface of the buffer layer 143, and the second supporting layer 153 is mainly configured to prevent the middle supporting portion 123 from being oxidized. In an example, the materials for the first supporting layer 133 and the second supporting layer 153 include silicon carbonitride, and the nitrogen content of the second supporting layer 153 is greater than the nitrogen content of the first supporting layer 133. Since the nitrogen content is relatively high, the second supporting layer 153 is endowed with relatively high oxidation resistance to prevent the second supporting layer 153 from being oxidized. In another example, the carbon content of the first supporting layer 133 is greater than the carbon content of the second supporting layer 153, so that it is ensured that the nitrogen content of the second supporting layer 153 is greater than the nitrogen content of the first supporting layer 133.

The first supporting layer 133 is arranged to be a silicon carbonitride layer with a relatively high carbon content, so that the stability of the middle supporting portion 123 is improved. The second supporting layer 153 is arranged to be a silicon carbonitride layer with a relatively high nitrogen content, so that the middle supporting portion 123 is prevented from being oxidized after the capacitor hole is etched, and an oxidized part of the middle supporting portion 123 may be prevented from being etched by DHF when the sacrificial layer is etched. In addition, the buffer layer 143 may further improve the oxidation resistance of the middle supporting portion 123.

In addition, in the embodiment, a range of a thickness relationship between the first supporting layer 133, the buffer layer 143, and the second supporting layer 153 is 2:1:2<the first supporting layer 133:the buffer layer 143:the second supporting layer 153<10:1:2. The thickness relationship between the first supporting layer 133, the buffer layer 143, and the second supporting layer 153 is reasonably set to ensure the stability of the middle supporting portion 123.

In an example, a thickness of the first supporting layer 133 is 4 nm to 30 nm, for example, 5 nm, 10 nm, 15 nm, 20 nm, 25 nm, or 30 nm. A thickness of the buffer layer 143 is 1 nm to 6 nm, for example, 1 nm, 2 nm, 3 nm, 4 nm, 5 nm, or 6 nm. A thickness of the second supporting layer 153 is 2 nm to 12 nm, for example, 2 nm, 4 nm, 6 nm, 8 nm, 10 nm, or 12 nm. It is to be noted that the above examples of the thicknesses of the first supporting layer 133, the buffer layer 143, and the second supporting layer 153 are only schematic descriptions about the thicknesses of the first supporting layer 133, the buffer layer 143, and the second supporting layer 153, and do not form limits to the embodiment of the disclosure.

In another embodiment, the middle supporting portion may also be formed by a double-layer structure. In such case, a material for the middle supporting portion includes a combination of silicon carbonitride and silicon nitride, namely silicon nitride is arranged above silicon carbonitride. Silicon carbonitride may be arranged in a manner that, from a bottom surface to a top surface, a nitrogen content gradually increases or a carbon content gradually decreases. It is to be noted that the method of forming a semiconductor structure is introduced in the embodiment taking the first stacking structure 1031 and the second stacking structure 1032 as an example, and in another embodiment, three or more than three stacking structures may be formed on the top surface of the bottom supporting layer.

An overlapping region is formed between the conducting layer 111 and an orthographic projection of the middle supporting portion 123 on the substrate 101 to ensure that a through hole is easily formed in the middle supporting portion by a subsequent process to expose the conducting layer 111, thereby forming the lower electrode electrically connected with the conducting layer 111.

The protective layer 106 is configured to prevent the edge of the middle supporting portion 123 from being oxidized. The edge of the middle supporting portion 123 is not oxidized and may not be etched away, so that the stability of the middle supporting portion 123 is ensured, the formed stacking structure 103 is stable, and the yield of a DRAM is improved.

In the embodiment, the semiconductor structure further includes first openings 109 in the top-layer supporting portion 163 and second openings in the middle supporting portion 123. Projections of the second opening and the first opening on the substrate 101 are completely overlapped or partially overlapped. The first opening and the second opening expose the sacrificial layer, and are configured to subsequently etch the sacrificial layer to form the air gap. The overalls of the first openings and the second openings can be formed radially. Compared with formation of openings in the related art, the overalls of the first openings and the second openings are formed radially, so that the overall number of formed first openings and second openings may be reduced, and the stability of the stacking structure may further be ensured.

Compared with the related art, the disclosure has the advantages that the protective layer prevents the edge of the supporting portion from being oxidized, and the edge of the supporting portion is not oxidized and may not be etched away, so that the stability of the supporting portion is ensured, the formed stacking structure is stable, and the yield of the DRAM is improved.

The abovementioned embodiments correspond to the present embodiment, so that the present embodiment can be matched with the abovementioned embodiments for implementation. The related technical details mentioned in the abovementioned embodiments are still effective in the present embodiment, and the technical effects that may be achieved in the abovementioned embodiments may also be achieved in the present embodiment. For reducing repetitions, elaborations are omitted herein. Correspondingly, related technical details mentioned in the present embodiment may also be applied to the abovementioned embodiments.

Those of ordinary skill in the art can understand that each embodiment is a specific embodiment implementing the disclosure, and in practical disclosures, various variations about the form and details can be made thereto without departing from the spirit and scope of the disclosure.

What is claimed is:

1. A semiconductor structure, comprising:
   a substrate, the substrate at least comprising a conducting layer;
   a bottom supporting layer, located at a top surface of the substrate;
   a stacking structure, located on a top surface of the bottom supporting layer, the stacking structure comprising a sacrificial layer and a supporting portion that are sequentially stacked and formed;
   a through hole, located in the stacking structure and exposing the conducting layer;
   a lower electrode, located on a sidewall of the through hole and electrically connected with the conducting layer; and
   a protective layer, located between the lower electrode and the supporting portion,
   wherein the stacking structure comprises a first stacking structure and a second stacking structure;
   the first stacking structure is on the top surface of the bottom supporting layer, and the first stacking structure comprises a first sacrificial layer and a middle supporting portion that are sequentially formed, wherein the middle supporting portion comprises: a first supporting layer, a buffer layer, and a second supporting layer, the first supporting layer and the second supporting layer are on surfaces of two opposing sides of the buffer layer, the first supporting layer is proximal to the substrate, and surfaces, distal from the buffer layer, of the first supporting layer and the second supporting layer are connected with the sacrificial layer;
   the second stacking structure is on a top surface of the first stacking structure, and the second stacking structure comprises a second sacrificial layer and a top-layer supporting portion that are sequentially formed; and
   the protective layer is between the lower electrode and the middle supporting portion;
   wherein materials for the second supporting layer and the first supporting layer comprise silicon carbonitride; a nitrogen content of the second supporting layer is greater than a nitrogen content of the first supporting layer; and a material for the buffer layer comprises silicon nitride.

2. The semiconductor structure of claim 1, wherein a range of a thickness relationship between the first supporting layer, the buffer layer, and the second supporting layer is
2:1:2<the first supporting layer:the buffer layer:the second supporting layer<10:1:2.

3. The semiconductor structure of claim 2, wherein
a thickness of the first supporting layer is 4 nm to 20 nm;
a thickness of the buffer layer is 1 nm to 6 nm; and
a thickness of the second supporting layer is 2 nm to 12 nm.

4. A semiconductor structure, comprising:
a substrate, the substrate at least comprising a conducting layer;
a bottom supporting layer, located at a top surface of the substrate;
a stacking structure, located on a top surface of the bottom supporting layer, the stacking structure comprising a sacrificial layer and a supporting portion that are sequentially stacked and formed;
a through hole, located in the stacking structure and exposing the conducting layer;
a lower electrode, located on a sidewall of the through hole and electrically connected with the conducting layer; and
a protective layer, located between the lower electrode and the supporting portion,
wherein the stacking structure comprises a first stacking structure and a second stacking structure;
the first stacking structure is on the top surface of the bottom supporting layer, and the first stacking structure comprises a first sacrificial layer and a middle supporting portion that are sequentially formed, wherein the middle supporting portion comprises: a first supporting layer, a buffer layer, and a second supporting layer, the first supporting layer and the second supporting layer are on surfaces of two opposing sides of the buffer layer, the first supporting layer is proximal to the substrate, and surfaces, distal from the buffer layer, of the first supporting layer and the second supporting layer are connected with the sacrificial layer;
the second stacking structure is on a top surface of the first stacking structure, and the second stacking structure comprises a second sacrificial layer and a top-layer supporting portion that are sequentially formed; and
the protective layer is between the lower electrode and the middle supporting portion; wherein
materials for the second supporting layer and the first supporting layer comprise silicon carbonitride;
a carbon content of the first supporting layer is greater than a carbon content of the second supporting layer; and
a material for the buffer layer comprises silicon nitride.

5. The semiconductor structure of claim 4, wherein a range of a thickness relationship between the first supporting layer, the buffer layer, and the second supporting layer is
2:1:2<the first supporting layer:the buffer layer:the second supporting layer<10:1:2.

6. The semiconductor structure of claim 5, wherein
a thickness of the first supporting layer is 4 nm to 20 nm;
a thickness of the buffer layer is 1 nm to 6 nm; and
a thickness of the second supporting layer is 2 nm to 12 nm.

* * * * *